United States Patent
Gupta et al.

(10) Patent No.: US 6,565,664 B2
(45) Date of Patent: *May 20, 2003

(54) METHOD FOR STRIPPING COPPER IN DAMASCENE INTERCONNECTS

(75) Inventors: Subhash Gupta, Singapore (SG); Simon Chooi, Singapore (SG); Paul Ho, Singapore (SG); Mei Sheng Zhou, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 10/131,519

(22) Filed: Apr. 24, 2002

(65) Prior Publication Data

US 2002/0115580 A1 Aug. 22, 2002

Related U.S. Application Data

(62) Division of application No. 09/442,312, filed on Nov. 22, 1999, now Pat. No. 6,394,114.

(51) Int. Cl.[7] ............................................... C23G 1/14
(52) U.S. Cl. .................. 134/2; 134/26; 134/29; 134/36; 134/42; 134/902; 510/254; 510/257; 510/264
(58) Field of Search ..................... 510/254, 257, 510/264; 134/2, 26, 29, 36, 42, 902

(56) References Cited

U.S. PATENT DOCUMENTS

| | | | | |
|---|---|---|---|---|
| 3,705,061 A | | 12/1972 | King ............................. | 156/19 |
| 4,311,551 A | * | 1/1982 | Sykes .......................... | 156/640 |
| 4,410,396 A | | 10/1983 | Somers et al. .............. | 156/664 |
| 5,207,867 A | | 5/1993 | Cordani ....................... | 156/651 |
| 5,244,539 A | | 9/1993 | McGrath et al. ............. | 156/656 |
| 5,348,590 A | | 9/1994 | Shigemura et al. ........... | 148/23 |
| 6,149,828 A | * | 11/2000 | Vaartstra ....................... | 216/57 |
| 6,150,282 A | * | 11/2000 | Rath et al. ................... | 438/745 |
| 6,394,114 B1 | * | 5/2002 | Gupta et al. ................. | 134/602 |

* cited by examiner

*Primary Examiner*—Sharidan Carrillo
(74) *Attorney, Agent, or Firm*—George O. Saile; Rosemary L. S. Pike

(57) ABSTRACT

An inexpensive and safe copper removal method in the fabrication of integrated circuits is described. Copper is stripped or removed by a chemical mixture comprising an ammonium salt, an amine, and water. The rate of copper stripping can be controlled by varying the concentration of the ammonium salt component and the amount of water in the mixture. Also a novel chemical mixture for stripping copper and removing copper contamination is provided. The novel chemical mixture for removing or stripping copper comprises an ammonium salt, an amine, and water. For example, the novel chemical mixture may comprise ammonium fluoride, water, and ethylenediamine in a ratio of 1:1:1.

9 Claims, 2 Drawing Sheets

METHOD FOR STRIPPING COPPER IN DAMASCENE INTERCONNECTS

This is a division of U.S. patent application Ser. No. 09/442,312 filing date Nov. 22, 1999, now U.S. Pat. No. 6,394,114, Method for Stripping Copper In Damascene Interconnects, assigned to the same assignee as the present invention.

BACKGROUND OF THE INVENTION (1) Field of the Invention

The invention relates to a method of copper stripping in the fabrication of integrated circuits, and more particularly, to a cheap and safe method of copper stripping using a novel chemical mixture in the manufacture of integrated circuits.

(2) Description of the Prior Art

In the manufacture of integrated circuits, copper stripping is required in a number of situations, for example, after electroplated copper deposition in a damascene process with complete selectivity to the barrier metal, or stripping of bulk copper from silicon wafers such as for rework. One method of removing copper has been to use nitric acid. This method has several drawbacks. High purity nitric acid is expensive. The corrosive nature of nitric acid renders the acid dangerous to operators and unsuitable for most cleaning equipment and creates a serious disposal problem. Finally, nitric acid oxidizes the surface of silicon and produces a thin oxide that hinders further removal of copper. It is desired to provide a safe, inexpensive method for removing copper.

U.S. Pat. No. 5,207,867 to Cordani teaches the use of an aqueous acid solution to be used after conventional copper stripping for the purpose of removing residual metal specie from the surface of an insulating layer. The solution includes a mineral acid, a fluoride ion, and an oxidizing agent such as hydrogen peroxide. U.S. Pat. No. 5,348,590 to Shigemura et al discloses a preflux to be formed only on copper and copper alloys. A chelating agent for reacting with copper ions is added to the preflux. The chelating agent may comprise aminocarboxylic acids such as ethylene diamene triacetic acid. U.S. Pat. No. 5,244,539 to McGrath et al teaches a solder-stripping aqueous solution that will not damage the underlying copper. The solution includes nitric acid, ferric ions, halide ions, and ammonium ions. U.S. Pat. No. 5,410,396 to Somers et al also discloses a solder-stripping solution that includes ammonium fluoride, hydrogen peroxide, acid, and an 8-hydroxyquinoline compound.

SUMMARY OF THE INVENTION

A principal object of the present invention is to provide an effective and very manufacturable method of copper stripping in the fabrication of integrated circuits.

Another object of the present invention is to provide an effective and very manufacturable method of copper stripping without attacking or damaging the barrier metal layer in the fabrication of integrated circuits.

Yet another object of the invention is to provide an inexpensive and safe copper removal method in the fabrication of integrated circuits.

Yet another object of the invention is to provide a novel copper stripping method which can be employed using wet cleaning equipment without corroding or destroying the equipment.

A further object is to provide a novel copper stripping method which can be employed to remove minute copper contamination from any equipment without corroding or destroying equipment parts.

A still further object is to provide a novel copper stripping method employing a chemical mixture comprising an ammonium salt, an amine, and water.

In accordance with the objects of this invention an inexpensive and safe copper removal method in the fabrication of integrated circuits is achieved. Copper is stripped or removed by a chemical mixture comprising an ammonium salt, an amine, and water. The rate of copper stripping can be controlled by the concentration of the ammonium salt component of the mixture.

Also in accordance with the objects of the invention, a novel chemical mixture for stripping copper is provided. The novel chemical mixture for removing or stripping copper comprises an ammonium salt, an amine, and water. For example, the novel chemical mixture may comprise ammonium fluoride, ethylenediamine, and water in a ratio of 1:1:1.

BRIEF DESCRIPTION OF THE DRAWINGS

In the accompanying drawings forming a material part of this description, there is shown.

DESCRIPTION OF THE PREFERRED EMBODIMENTS

Figure 1:
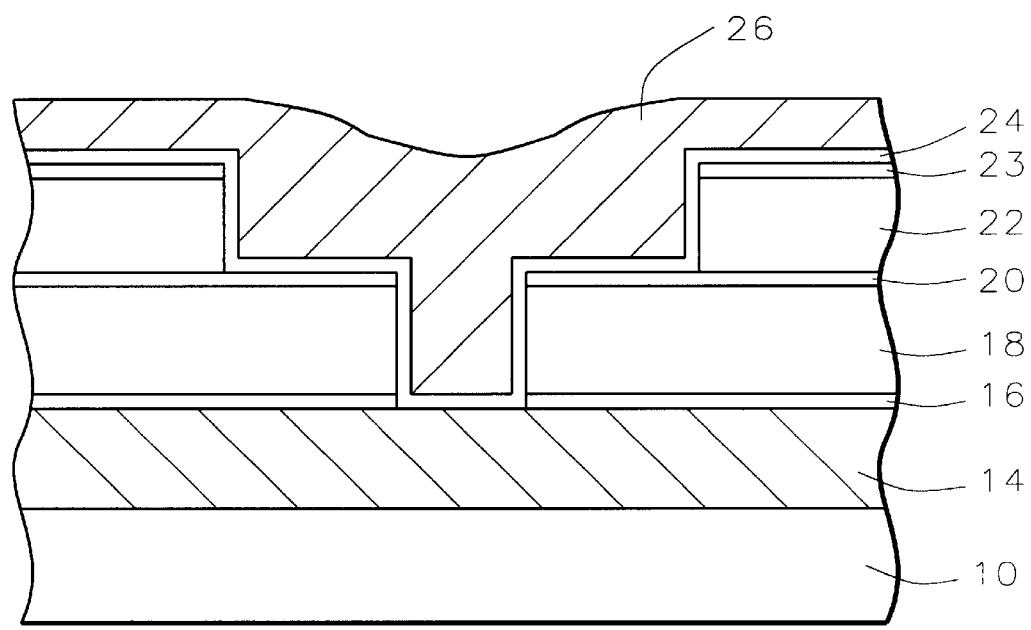
FIG. 1 schematically illustrates in cross-sectional representation a dual damascene application of the present invention.
Figure 2:
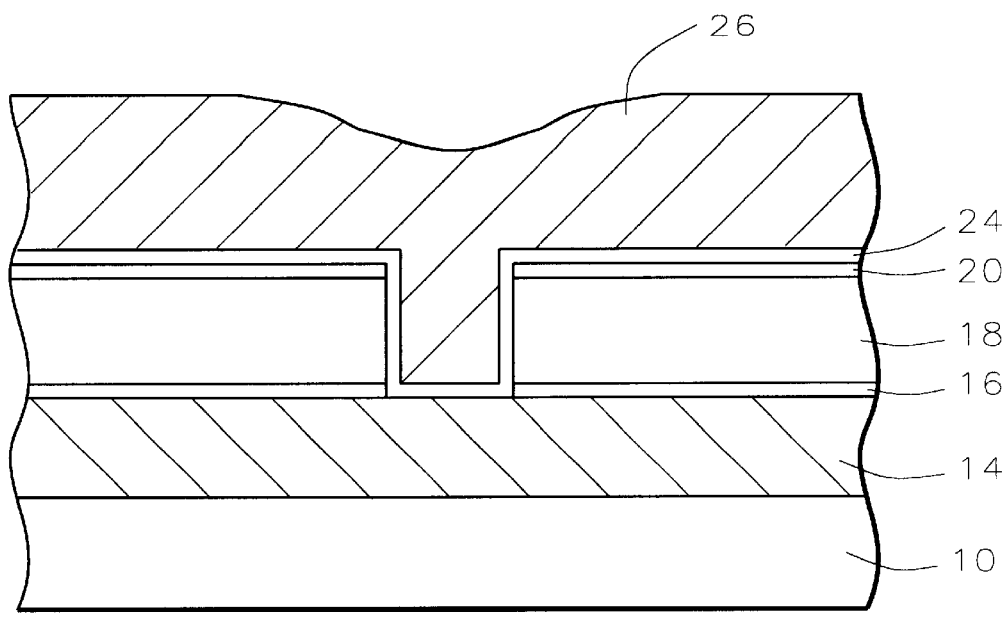
FIG. 2 schematically illustrates in cross-sectional representation a single damascene application of the present invention.
Figure 3:
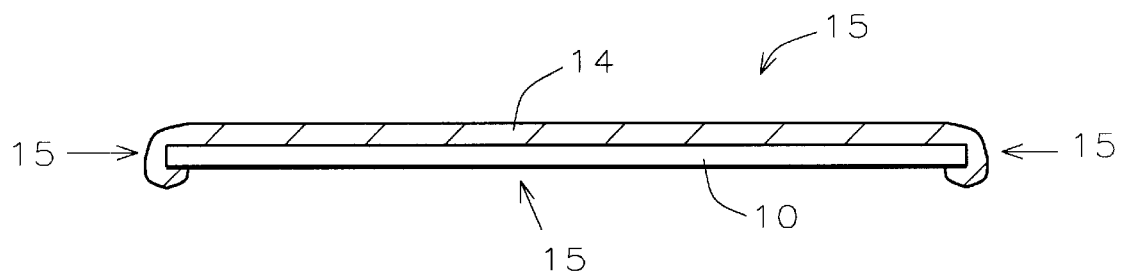
FIG. 3 schematically illustrates in cross-sectional representation a bulk copper stripping application of the present invention.

Copper stripping is performed in a variety of applications. For example, FIGS. 1 through 3 illustrate three of the many applications of the copper stripping process of the present invention. It is to be understood by those skilled in the art that the process and novel chemical mixture of the present invention are not limited to the applications illustrated in these figures. Rather, the process and chemical mixture of the invention can be used in any application in which it is desired to provide a safe and inexpensive method of copper removal.

FIG. 1 illustrates a dual damascene application. A dual damascene opening has been etched through the optional cap layer (23), dielectric (22, 18), etch stop layer (20), and passivation layer (16) to the underlying metal line 14 to be contacted. This metal line 14 may be a copper or aluminum-copper line or a tungsten lead. A barrier metal layer 24, such as tantalum nitride or tungsten nitride is deposited over the topmost dielectric layer 22, or the optional cap layer 23, and within the dual damascene opening. A copper layer 26 is formed, for example, by vapor deposition and electroplating to fill the opening. Now, the excess copper 26 not within the dual damascene opening must be removed with complete selectivity to the barrier metal. It is also appropriate that all of the copper in the damascene opening can be removed with complete selectivity to the barrier metal.

FIG. 2 illustrates a single damascene in-laid application. A single damascene opening has been etched through the optional cap layer (23), dielectric (19), and passivation layer (16) to the underlying copper or aluminum-copper line or a tungsten lead (14) to be contacted. It is to be understood by those skilled in the art that the excess copper 26 deposited over the barrier metal layer 24 needs to be removed with complete selectivity to the barrier metal. It is also appropriate that all of the copper in the damascene opening can be removed with complete selectivity to the barrier metal and without attacking or damaging the barrier metal.

FIG. 3 illustrates a third example application of copper stripping. A wafer 10 is illustrated having a coating of copper 14 thereover. Stripping is indicated by arrows 15. For example, as shown in FIG. 3, copper 14 may be removed from the front side of the wafer only. In other examples, not shown, copper may be removed from the backside, from the bevel only, from both front and back sides, or from the bevel and both front and back sides. This application may be used when rework is required.

Yet another unillustrated application of copper stripping is performed in any equipment found in a wafer fabrication plant. The copper stripping can be performed after the wafer or wafers have been processed, during preventive maintenance, or after breakage of a wafer in the equipment. In the event of wafer breakage, the wafer may incorporate copper in the form of 100% copper or in the form of aluminum-copper alloy, which occur in one or more layers in the fabrication of microelectronic devices or which occur as a sole film (with or without one or more layers above or below this film) on a silicon wafer. The copper stripping solution of the invention can be applied in this application by placing it on a cleanroom cloth and then wiping the equipment parts and surfaces with the cloth.

The process of the invention proposes a novel method for safe and inexpensive stripping or removal of copper in any application. The process of the invention can be employed using wet cleaning equipment without corroding or destroying the equipment. The method employed is the use of a chemical mixture that comprises an ammonium salt and an amine. It is pertinent that the ammonium salt be used in a form in which it is dissolved in a solution (for instance, water) and not in a solid form.

The chemical mixture for the dissolution of copper comprises an ammonium salt, water, and an amine. The ammonium salts is ammonium fluoride. Ammonium fluoride solution is commercially available as a 40% solution (e.g. from Ashland Chemicals). Amines may include ethylenediamine ($H_2NCH_2CH_2NH_2$), 1,2-diaminopropane ($CH_3CH(NH_2)CH_2NH_2$), and 1,3-diaminopropane ($H_2NCH_2CH_2CH_2NH_2$).

For example, a mixture of ammonium fluoride, ethylenediamine and water in a ratio of 1:1:1 will be able to strip elemental copper at rates of about 5 microns per minute at room temperature. Furthermore, the reaction can be controlled by increasing or decreasing the ratio of ammonium fluoride and also by the quantity of water that is added to the mixture. For instance, a mixture of ammonium fluoride, ethylenediamine, and water in a ratio of 1:1:10 will strip copper at a slower rate relative to the same mixture at a 1:1:1 ratio. similarly, the rate of removal can be controlled by increasing or decreasing the ratio of ammonium fluoride in the solution, for example, from 1:1:1 to 0.5:1:1.

The process of the present invention provides a method for safe and inexpensive copper stripping for any application. A novel chemical mixture is employed to effect the desired safe and inexpensive copper stripping.

While the invention has been particularly shown and described with reference to the preferred embodiments thereof, it will be understood by those skilled in the art that various changes in form and details may be made without departing from the spirit and scope of the invention.

What is claimed is:

1. A method of removing copper from a wafer comprising:
    providing a copper layer on said wafer overlying a barrier metal layer of tantalum nitride or tungsten nitride; and
    removing said copper layer from said wafer using a chemical mixture consisting of an ammonium salt, water, and an amine wherein said barrier metal layer is not removed.

2. The method according to claim 1 wherein said copper layer is removed from a frontside only of said wafer.

3. The method according to claim 1 wherein said copper layer is removed from a backside only of said wafer.

4. The method according to claim 1 wherein said copper layer is removed from a bevel edge only of said wafer.

5. The method according to claim 1 wherein said copper layer is removed from a frontside and a backside of said wafer.

6. The method according to claim 1 wherein said copper layer is removed from a frontside, a backside, and a bevel edge of said wafer.

7. The method according to claim 1 wherein said ammonium salt is ammonium fluoride.

8. The method according to claim 1 wherein said amine is ethylenediamine, 1,2-diaminopropane, or 1,3-diaminopropane.

9. The method according to claim 1 wherein said chemical mixture consists of ammonium fluoride, water, and ethylene diamine in a ratio of 1:1:1.

* * * * *